(12) United States Patent
Berroteran Gil et al.

(10) Patent No.: US 9,562,950 B2
(45) Date of Patent: Feb. 7, 2017

(54) AUTOMATED METHOD AND APPARATUS FOR TESTING A CROWBAR CIRCUIT OF A POWER CONVERTER

(71) Applicant: General Electric Company, Schenectady, NY (US)

(72) Inventors: Igor Berroteran Gil, Salem, VA (US); Anthony Michael Klodowski, Hardy, VA (US); David Smith, Daleville, VA (US); Robert Allen Seymour, Roanoke, VA (US); Benjamin Arthur Niemoeller, Cave Spring, VA (US)

(73) Assignee: General Electric Company, Schenectady, NY (US)

( * ) Notice: Subject to any disclaimer, the term of this patent is extended or adjusted under 35 U.S.C. 154(b) by 357 days.

(21) Appl. No.: 14/260,596

(22) Filed: Apr. 24, 2014

(65) Prior Publication Data

US 2015/0309123 A1    Oct. 29, 2015

(51) Int. Cl.
  *G01R 31/40*    (2014.01)
  *G01R 19/165*    (2006.01)
  (Continued)

(52) U.S. Cl.
  CPC ......... *G01R 31/40* (2013.01); *G01R 19/16538* (2013.01); *G01R 31/025* (2013.01); *G01R 31/42* (2013.01); *H02S 50/10* (2014.12)

(58) Field of Classification Search
  CPC ....... G01R 31/40; G01R 31/42; G01R 31/025; G01R 19/16538; H02S 50/10
  (Continued)

(56) References Cited

U.S. PATENT DOCUMENTS 5,046,345 A * 9/1991 Zieve ................. B21D 1/06
                                              361/155
7,971,613 B2 * 7/2011 Gass ................. B23Q 11/0092
                                              144/136.1
(Continued)

FOREIGN PATENT DOCUMENTS

WO   WO 2011/082855   7/2011

OTHER PUBLICATIONS

Dedié, Philipp, Sigo Scharnholz, and Volker Brommer. "ICCOS counter-current thyristor high-power opening switch for currents up to 28 kA." Electromagnetic Launch Technology, 2008 14th Symposium on. IEEE, 2008.*

(Continued)

*Primary Examiner* — Jermele M Hollington
*Assistant Examiner* — Christopher McAndrew
(74) *Attorney, Agent, or Firm* — Dority & Manning, P.A.

(57) ABSTRACT

The present disclosure is directed to an automated apparatus and method for testing a crowbar circuit of power converter. The crowbar circuit includes an anti-parallel diode and a voltage-controlled switching element, e.g. a silicon-controlled rectifier (SCR). The method includes implementing a first test sequence for testing operability of the diode and a second test sequence for testing operability of the voltage-controlled switching element. More specifically, the first test sequence determines a first current-voltage feedback that is indicative of the operability of the diode and the second test sequence determines a second current-voltage feedback that is indicative of the operability of the voltage-controlled switching element.

16 Claims, 9 Drawing Sheets

(51) Int. Cl.
*H02S 50/10* (2014.01)
*G01R 31/42* (2006.01)
*G01R 31/02* (2006.01)

(58) Field of Classification Search
USPC .................................................. 324/764.01
See application file for complete search history.

(56) References Cited

U.S. PATENT DOCUMENTS

| | | | |
|---|---|---|---|
| 7,978,445 B2 | 7/2011 | Ritter | |
| 8,411,474 B2* | 4/2013 | Roesner | H02M 7/487 363/56.01 |
| 8,570,003 B2* | 10/2013 | Lu | H02P 9/007 318/268 |
| 2007/0247091 A1* | 10/2007 | Maiocchi | H02M 3/156 318/400.04 |
| 2010/0265740 A1* | 10/2010 | Zargari | H02M 1/08 363/17 |
| 2011/0068723 A1* | 3/2011 | Maiocchi | H02M 3/156 318/400.3 |
| 2012/0024427 A1* | 2/2012 | Gass | B23Q 11/0092 144/427 |
| 2012/0053750 A1 | 3/2012 | Viassolo et al. | |
| 2012/0262129 A1* | 10/2012 | Lu | H02P 9/10 322/28 |
| 2015/0309119 A1* | 10/2015 | Berroteran Gil | G01R 31/42 324/764.01 |

OTHER PUBLICATIONS

Chen, WenJun, et al. "Experimental and simulation comparison for timer action crowbar of doubly-fed induction generator." Power and Energy Engineering Conference (APPEEC), 2011 Asia-Pacific. IEEE, 2011.*

Niiranen, Jouko. "Voltage dip ride through of a doubly-fed generator equipped with an active crowbar." Nordic wind power conference. vol. 1. 2004.*

Kim et al., Grid-Tied Power Converter for Battery Energy Storage Composed of 2-Stage DC-DC Converter, Journal of Electrical Engineering & Technology, vol. 8, No. 6, Nov. 2013, pp. 742-750.

Co-pending U.S. Appl. No. 14/136,018, filed Dec. 20, 2013.

* cited by examiner

AUTOMATED METHOD AND APPARATUS FOR TESTING A CROWBAR CIRCUIT OF A POWER CONVERTER

FIELD OF THE INVENTION

The present disclosure relates generally to renewable energy power systems and, more particularly, to an automated method and apparatus for testing a power converter for use in a renewable energy power system, such as a wind turbine.

BACKGROUND OF THE INVENTION

Renewable energy power systems, such as wind energy power systems and solar energy power systems, often include a power converter with a regulated DC link. For example, wind power systems, such as wind driven doubly-fed induction generator (DFIG) systems or full power conversion systems, can include a power converter with an AC-DC-AC topology. Solar power systems can include a power converter that has a DC-DC-AC topology.

An energy storage system can be coupled to the DC link of a power converter in a renewable energy system. The energy storage system can be used, for instance, to apply power to the DC link of the power converter during transient conditions. A switching power supply can be provided to transfer energy back and forth between the DC link of the power converter and the energy storage device. For instance, the switching power supply can include a DC-DC power converter configured to convert a first voltage on the DC link to a second voltage at the energy storage device, and vice versa. It can be desirable for the switching power supply to be bi-directional to allow not only for power flow from the energy storage device to the DC link during transient conditions but also to allow power flow from the DC link to the energy storage device, for instance, to charge the energy storage device.

Certain power converters, however, may have complex systems built around a certain topology, e.g. a DC-DC power converter. For example, standard DC-DC power converters may include a bridge circuit and a power filter. In certain embodiments, the power filter may also include a crowbar circuit. Thus, interconnection and characteristics of the components of the power converter need to be tested to ensure proper performance of the converter and proper connection with the energy storage system. In addition, in various instances, the converter and its components may need to be re-tested, which can be time-consuming and expensive. Such instances may include, for example, after troubleshooting a malfunction in the power converter, after repairing the power converter, or after subjecting the power converter to one or more structural modifications.

Accordingly, a method and apparatus that addresses the aforementioned problems would be welcomed in the technology. More specifically, a method and apparatus that automatically tests various electrical components of the power converter, e.g. the crowbar circuit, to ensure proper connection between the converter and the existing power conversion assembly would be desired in the art.

BRIEF DESCRIPTION OF THE INVENTION

Aspects and advantages of the invention will be set forth in part in the following description, or may be obvious from the description, or may be learned through practice of the invention.

In one aspect, the present subject matter is directed to a method for testing a crowbar circuit of a power converter with an existing power conversion assembly of a renewable energy system. The method includes implementing a first test sequence for testing operability of an anti-parallel diode of the crowbar circuit. Another step includes determining a first current-voltage feedback of the power converter based on the first test sequence, wherein the first current-voltage feedback is indicative of operability of the anti-parallel diode of the crowbar circuit. The method also includes implementing a second test sequence for testing operability of a voltage-controlled switching element of the crowbar circuit. Another step includes determining a second current-voltage feedback of the power converter based on the second test sequence, wherein the second current-voltage feedback is indicative of operability of the voltage-controlled switching element of the crowbar circuit.

In another aspect, the present subject matter is directed to a method for testing a crowbar circuit within the power converter with an existing power conversion assembly of a renewable energy system. The method includes implementing a first test sequence for testing operability of a voltage-controlled switching element of the crowbar circuit. Another step includes determining a first current-voltage feedback of the power converter based on the first test sequence, wherein the first current-voltage feedback is indicative of operability of the voltage-controlled switching element of the crowbar circuit. The method also includes implementing a second test sequence for testing operability of an anti-parallel diode of the crowbar circuit. Another step includes determining a second current-voltage feedback of the power converter based on the second test sequence, wherein the second current-voltage feedback is indicative of operability of the anti-parallel diode of the crowbar circuit.

In yet another aspect, the present subject matter is directed to an automated apparatus for testing a crowbar circuit within a power converter with an existing power conversion assembly of a renewable energy system. The apparatus includes the power converter electrically coupled with the existing power conversion assembly and a controller communicatively coupled to the power converter. The power converter includes a bridge circuit, a power filter, and a crowbar circuit. The crowbar circuit includes a voltage-controlled switching element and an anti-parallel diode. The controller is configured to perform a plurality of operations, including, but not limited to implementing one or more test sequences for testing operability of the crowbar circuit. For example, in one embodiment, the test sequence includes: transferring a first pulse of energy from the existing power conversion assembly to a capacitive element of the power filter through the bridge circuit, implementing a non-gating interval so as to allow the first pulse of energy to decay, transferring a second pulse of energy through a second switching element of the bridge circuit such that a bridge circuit voltage is driven substantially to zero, thereby transferring the first pulse of energy from the capacitive element to the inductive element of the power filter, determining a first current-voltage feedback of the power filter after the power filter reaches a steady-state condition, wherein the first current-voltage feedback is indicative of the operability of the diode. If the diode is operating properly, the test sequence may also include transferring a plurality of additional pulses of energy from the existing power conversion assembly through the bridge circuit to the power filter in conjunction with interleaving non-gating intervals between each of the additional pulses of energy until a filter voltage reaches a predetermined voltage, transferring a final pulse of energy that causes the filter voltage to surpass the predetermined voltage, determining a second current-voltage feedback of the power filter after the power filter reaches a steady-state condition, and determining whether the voltage-controlled switching element is operating properly based on the second current-voltage feedback and the predetermined voltage.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to an automated apparatus and method for testing a crowbar circuit within a power converter, e.g. a DC-DC power converter, that is configured to be installed as part of a renewable energy system, e.g. a wind turbine. The apparatus is configured to test the crowbar circuit during installation/start-up, normal operation, and/or at any other suitable time. In addition, the apparatus can be initiated by an operator or may be automatically initiated according to various operational functions, e.g. with every startup sequence, etc. In one embodiment, the present disclosure implements a first test sequence for testing an anti-parallel diode of the crowbar circuit and, if the diode is operating properly, the apparatus implements a second test sequence for testing a voltage-controlled switching element (e.g. a silicon-controlled rectifier (SCR)) of the crowbar circuit. In another embodiment, the present disclosure implements a first test sequence for testing the SCR and, if the SCR is operating properly, the apparatus implements a second test sequence for testing the diode of the crowbar circuit. Thus, it should be understood that the test sequences as described herein may be performed in any order.

In various embodiments, the diode test sequence includes pushing a first pulse of energy, e.g. a nominal peak current of the power filter, from the existing power conversion assembly into a capacitive element of the power filter of the power converter. Once transient signals decay, the apparatus pushes a second, longer pulse of energy through a second switching element of the bridge circuit such that a bridge circuit voltage is driven substantially to zero, thereby transferring the first pulse of energy from the capacitive element to an inductive element of the power filter. In further embodiments, the length of the second pulse is substantially equal to a full period of the expected natural frequency of a dominant inductive element and a dominant capacitive element of the power filter. The test sequence then includes determining a current-voltage feedback of the power filter when the power filter reaches a steady-state condition. The current-voltage feedback of the diode test sequence is expected to be near zero, therefore, the presence and operability of the diode can be automatically verified based on the current-voltage feedback.

In further embodiments, the method of the present disclosure implements another test sequence for testing the voltage-controlled switching element, e.g. the SCR, of the crowbar circuit. Such a test sequence includes transferring a plurality of additional pulses of energy from the existing power conversion assembly to the power filter in conjunction with interleaving non-gating intervals between each of the additional pulses of energy until a filter voltage reaches a predetermined voltage. More specifically, the DC link of the existing power conversion assembly is used to push charge into the power filter of the power converter, which manifests as a nonzero voltage when current extinguishes. A later period of gating inactivity provides an opportunity to probe the remaining voltage resulting from transferred charge. The new voltage becomes an initial condition that, together with crowbar nominal voltage and nominal converter current, is used to compute the following gating pulse. Once developed voltage approaches a region where the voltage-controlled switching element will turn on, e.g. a predetermined voltage, the next pulse is such that the voltage-controlled switching element is guaranteed to turn on while still operating within a safe operating voltage region when the switching element is present and operating properly. Such behavior is desirable in order to improve detectability of the voltage-controlled switching element and to prevent overheating of the voltage-controlled switching element gating circuitry. When the predetermined voltage is reached so as to induce the voltage-controlled switching element to turn on, voltage across the capacitive elements in the power filter is expected to collapse due to the low resistance path provided by the voltage-controlled switching element and its resistors in series. Once gating ceases and current disappears, the current-voltage feedback is expected to be near zero, therefore, the presence and operability of the voltage-controlled switching element can be automatically verified based on the current-voltage feedback.

The present subject matter has many advantages not present in the prior art. For example, in various embodiments, the present disclosure provides an automated system for testing a crowbar circuit of a power converter that is installed as a subsystem of the overall renewable energy system so as to provide energy storage capabilities to the energy system. In further embodiments, the present subject matter supports research and development, manufacturing testing, diagnosis and repair, and/or field installations of various types of power converters, as subsystems of the overall energy system. Thus, the present disclosure provides standardized and consistent design and development practices, time savings, product differentiation through self-diagnosis, and increased value to commercial offerings.

Figure 1:
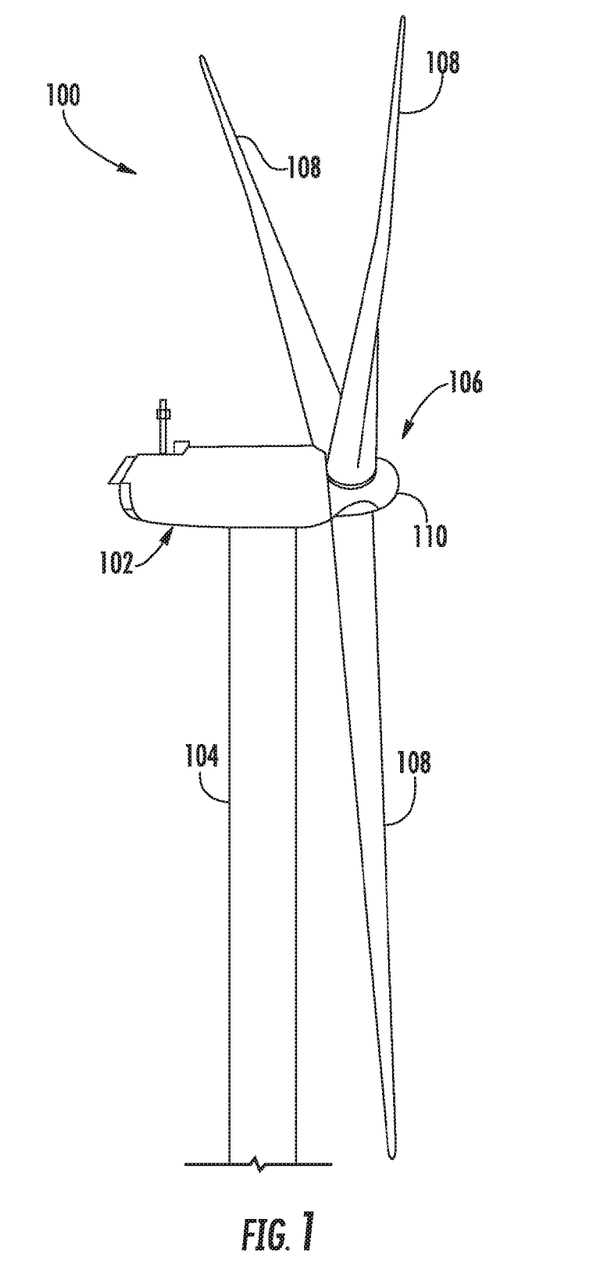
FIG. 1 illustrates a perspective view of a portion of one embodiment of a wind turbine according to the present disclosure.

Referring now to the drawings, FIG. 1 is a perspective view of a portion of an exemplary wind turbine 100 according to the present disclosure that is configured to implement the method and apparatus as described herein. The wind turbine 100 includes a nacelle 102 that typically houses a generator (not shown). The nacelle 102 is mounted on a tower 104 having any suitable height that facilitates operation of wind turbine 100 as described herein. The wind turbine 100 also includes a rotor 106 that includes three blades 108 attached to a rotating hub 110. Alternatively, the wind turbine 100 may include any number of blades 108 that facilitates operation of the wind turbine 100 as described herein.

Figure 2:
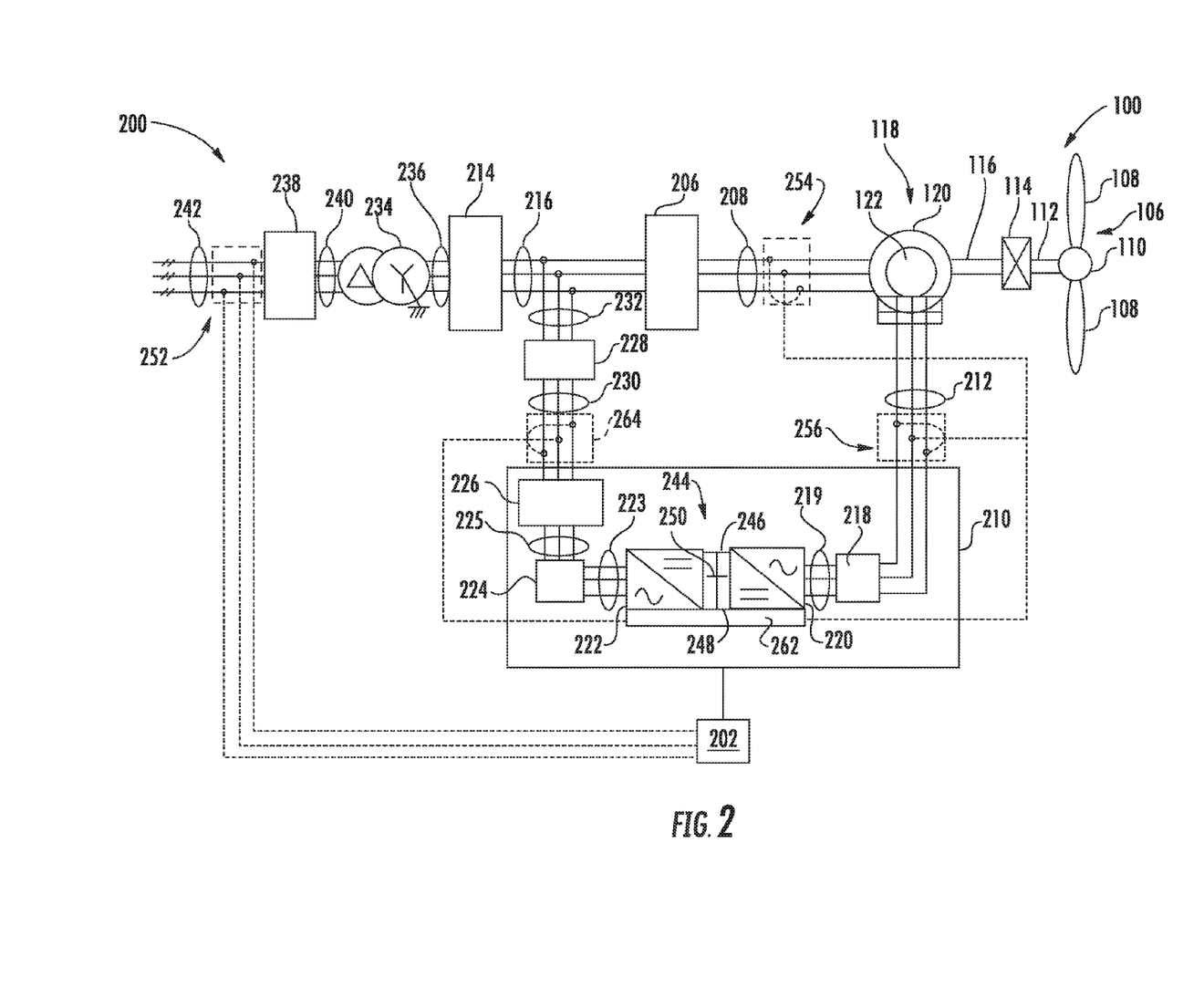
FIG. 2 illustrates a schematic view of one embodiment of an electrical and control system suitable for use with the wind turbine shown in FIG. 1.

Referring to FIG. 2, a schematic view of an exemplary electrical and control system 200 that may be used with the wind turbine 100 is illustrated. During operation, wind impacts the blades 108 and the blades 108 transform wind energy into a mechanical rotational torque that rotatably drives a low-speed shaft 112 via the hub 110. The low-speed shaft 112 is configured to drive a gearbox 114 that subsequently steps up the low rotational speed of the low-speed shaft 112 to drive a high-speed shaft 116 at an increased rotational speed. The high-speed shaft 116 is generally rotatably coupled to a generator 118 so as to rotatably drive a generator rotor 122. In one embodiment, the generator 118 may be a wound rotor, three-phase, double-fed induction (asynchronous) generator (DFIG) that includes a generator stator 120 magnetically coupled to a generator rotor 122. As such, a rotating magnetic field may be induced by the generator rotor 122 and a voltage may be induced within a generator stator 120 that is magnetically coupled to the generator rotor 122. In one embodiment, the generator 118 is configured to convert the rotational mechanical energy to a sinusoidal, three-phase alternating current (AC) electrical energy signal in the generator stator 120. The associated electrical power can be transmitted to a main transformer 234 via a stator bus 208, a stator synchronizing switch 206, a system bus 216, a main transformer circuit breaker 214, and a generator-side bus 236. The main transformer 234 steps up the voltage amplitude of the electrical power such that the transformed electrical power may be further transmitted to a grid via a breaker-side bus 240, a grid circuit breaker 238, and a grid bus 242.

Figure 3:
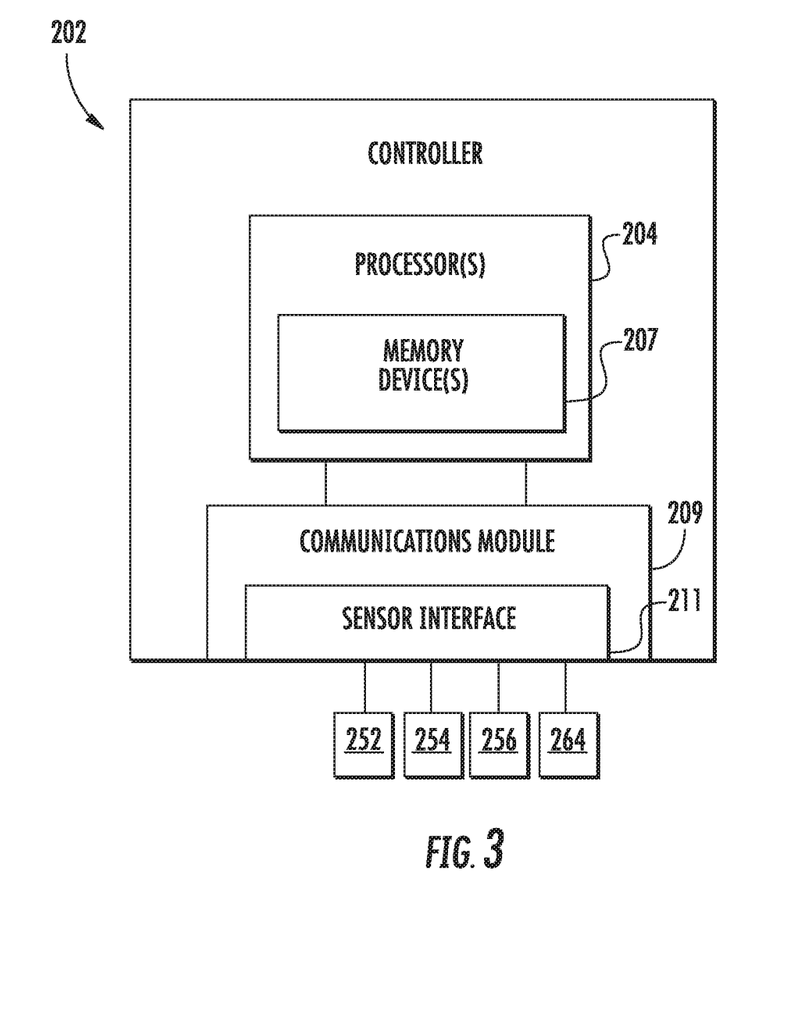
FIG. 3 illustrates a block diagram of one embodiment of a controller suitable for use with the wind turbine shown in FIG. 1.

In addition, the electrical and control system 200 may include a wind turbine controller 202 configured to control any of the components of the wind turbine 100. For example, as shown particularly in FIG. 3, the controller 202 may include one or more processor(s) 204 and associated memory device(s) 207 configured to perform a variety of computer-implemented functions (e.g., performing the methods, steps, calculations and the like and storing relevant data as disclosed herein). Additionally, the controller 202 may also include a communications module 209 to facilitate communications between the controller 202 and the various components of the wind turbine 100, e.g. any of the components of FIG. 2. Further, the communications module 209 may include a sensor interface 211 (e.g., one or more analog-to-digital converters) to permit signals transmitted from one or more sensors to be converted into signals that can be understood and processed by the processors 204. It should be appreciated that the sensors (e.g. sensors 252, 254, 256, 264) may be communicatively coupled to the communications module 209 using any suitable means. For example, as shown in FIG. 3, the sensors 252, 254, 256, 264 are coupled to the sensor interface 211 via a wired connection. However, in other embodiments, the sensors 252, 254, 256, 264 may be coupled to the sensor interface 211 via a wireless connection, such as by using any suitable wireless communications protocol known in the art. As such, the processor 204 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 204 is also configured to compute advanced control algorithms and communicate to a variety of Ethernet or serial-based protocols (Modbus, OPC, CAN, etc.). Additionally, the memory device(s) 207 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 207 may generally be configured to store suitable computer-readable instructions that, when implemented by the processor(s) 204, configure the controller 202 to perform the various functions as described herein.

Referring back to FIG. 2, the generator stator 120 may be electrically coupled to a stator synchronizing switch 206 via a stator bus 208. In one embodiment, to facilitate the DFIG configuration, the generator rotor 122 is electrically coupled to a bi-directional power conversion assembly 210 via a rotor bus 212. Alternatively, the generator rotor 122 may be electrically coupled to the rotor bus 212 via any other device that facilitates operation of electrical and control system 200 as described herein. In a further embodiment, the stator synchronizing switch 206 may be electrically coupled to a main transformer circuit breaker 214 via a system bus 216.

The power conversion assembly 210 may include a rotor filter 218 that is electrically coupled to the generator rotor 122 via the rotor bus 212. A rotor filter bus 219 electrically couples the rotor filter 218 to a rotor-side power converter 220. Further, the rotor-side power converter 220 may be electrically coupled to a line-side power converter 222 via a single direct current (DC) link 244. Alternatively, the rotor-side power converter 220 and the line-side power converter 222 may be electrically coupled via individual and separate DC links. In addition, as shown, the DC link 244 may include a positive rail 246, a negative rail 248, and at least one capacitor 250 coupled therebetween.

In addition, a line-side power converter bus 223 may electrically couple the line-side power converter 222 to a line filter 224. Also, a line bus 225 may electrically couple the line filter 224 to a line contactor 226. Moreover, the line contactor 226 may be electrically coupled to a conversion circuit breaker 228 via a conversion circuit breaker bus 230. In addition, the conversion circuit breaker 228 may be electrically coupled to the main transformer circuit breaker 214 via system bus 216 and a connection bus 232. The main transformer circuit breaker 214 may be electrically coupled to an electric power main transformer 234 via a generator-side bus 236. The main transformer 234 may be electrically coupled to a grid circuit breaker 238 via a breaker-side bus 240. The grid circuit breaker 238 may be connected to the electric power transmission and distribution grid via a grid bus 242.

In operation, alternating current (AC) power generated at the generator stator 120 by rotation of the rotor 106 is provided via a dual path to the grid bus 242. The dual paths are defined by the stator bus 208 and the rotor bus 212. On the rotor bus side 212, sinusoidal multi-phase (e.g. three-phase) AC power is provided to the power conversion assembly 210. The rotor-side power converter 220 converts the AC power provided from the rotor bus 212 into DC power and provides the DC power to the DC link 244. Switching elements used in bridge circuits of the rotor side power converter 220 can be modulated to convert the AC power provided from the rotor bus 212 into DC power suitable for the DC link 244.

The line side converter 222 converts the DC power on the DC link 244 into AC output power suitable for the electrical grid bus 242. In particular, switching elements used in bridge circuits of the line side power converter 222 can be modulated to convert the DC power on the DC link 244 into AC power on the line side bus 225. The AC power from the power conversion assembly 210 can be combined with the power from the stator 120 to provide multi-phase power (e.g. three-phase power) having a frequency maintained substantially at the frequency of the electrical grid bus 242 (e.g. 50 Hz/60 Hz). It should be understood that the rotor-side power converter 220 and the line-side power converter 222 may have any configuration using any switching devices that facilitate operation of electrical and control system 200 as described herein.

Further, the power conversion assembly 210 may be coupled in electronic data communication with the turbine controller 202 and/or a separate or integral converter controller 262 to control the operation of the rotor-side power converter 220 and the line-side power converter 222. For example, during operation, the controller 202 may be configured to receive one or more voltage and/or electric current measurement signals from the first set of voltage and electric current sensors 252. Thus, the controller 202 may be configured to monitor and control at least some of the operational variables associated with the wind turbine 100 via the sensors 252. In the illustrated embodiment, each of the sensors 252 may be electrically coupled to each one of the three phases of grid bus 242. Alternatively, the sensors 252 may be electrically coupled to any portion of electrical and control system 200 that facilitates operation of electrical and control system 200 as described herein. In addition to the sensors described above, the sensors may also include a second set of voltage and electric current sensors 254, a third set of voltage and electric current sensors 256, a fourth set of voltage and electric current sensors 264 (all shown in FIG. 2), and/or any other suitable sensors.

It should also be understood that any number or type of sensors may be employed within the wind turbine 100 and at any location. For example, the sensors may be a Micro Inertial Measurement Units (MIMUs), strain gauges, accelerometers, pressure sensors, temperature sensors, angle of attack sensors, vibration sensors, Light Detecting and Ranging (LIDAR) sensors, camera systems, fiber optic systems, anemometers, wind vanes, Sonic Detection and Ranging (SODAR) sensors, infra lasers, radiometers, pitot tubes, rawinsondes, other optical sensors, and/or any other suitable sensors.

As mentioned, the system 200 may also include a converter controller 262 configured to receive one or more voltage and electric current measurement signals. For example, as shown in the illustrated embodiment, the converter controller 262 receives voltage and electric current measurement signals from the second set of voltage and electric current sensors 254 coupled in electronic data communication with stator bus 208. The converter controller 262 may also receive the third and fourth set of voltage and electric current measurement signals from the third and fourth set of voltage and electric current sensors 256, 264. In addition, the converter controller 262 may be configured with any of the features described herein in regards to the main controller 202. Further, the converter controller 262 may be separate from or integral with the main controller 202.

Figure 4:
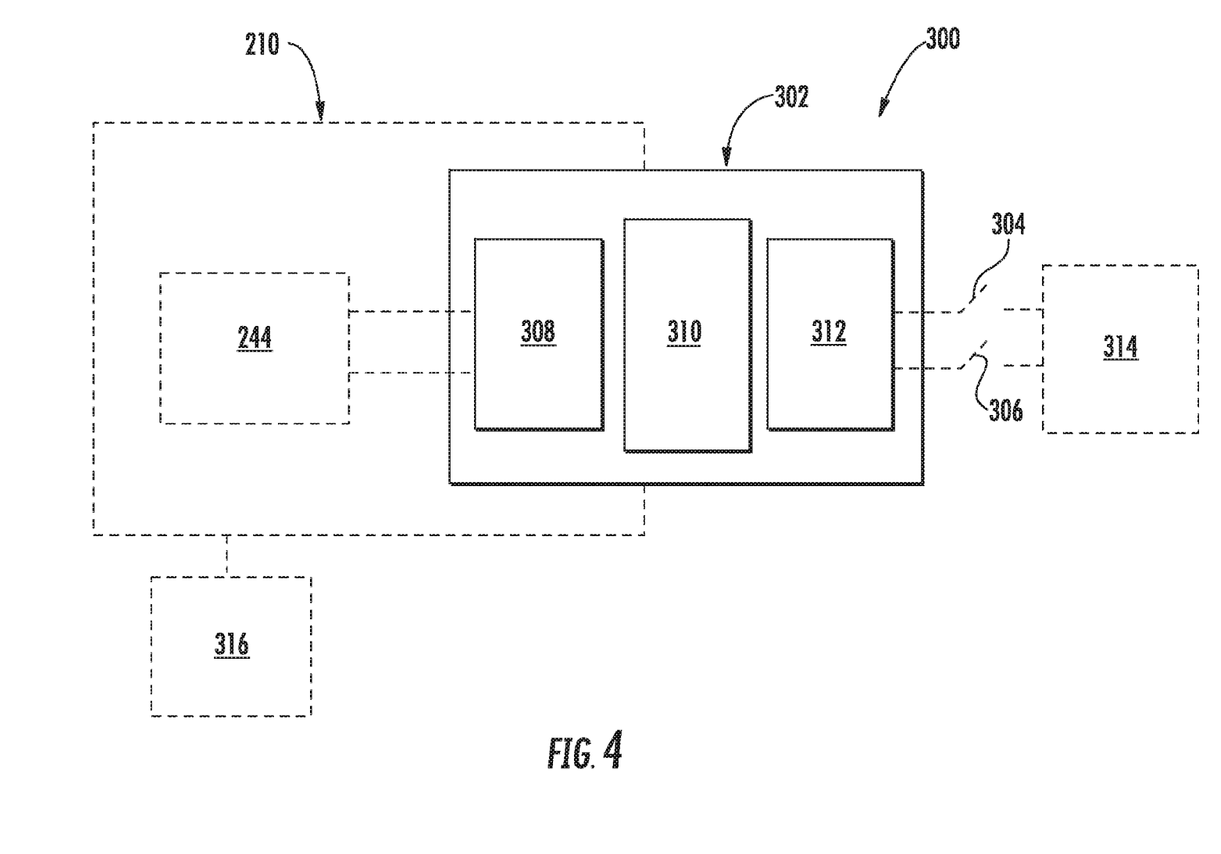
FIG. 4 illustrates a schematic diagram of one embodiment of an automated apparatus for testing a crowbar circuit of a power converter according to the present disclosure.

Referring now to FIG. 4, one embodiment of an apparatus 300 for testing various components of the power converter 302 according to the present disclosure is illustrated. As shown, the apparatus 300 includes the power converter 302 electrically coupled to the existing power conversion assembly 210 via the DC link 244. In addition, the power converter 302 includes various electrical components, including, but not limited to a bridge circuit 308, one or more electrical disconnecting devices 310 (e.g. a breaker), and a power filter 312. Once the apparatus 300 successfully verifies performance of one or more electrical components of the power converter 302, an energy storage system 314 (e.g. one or more battery modules) may be electrically connected to the existing power conversion assembly 210 by the power converter 302 via one or more switches 304, 306. It should be understood that the energy storage system 314 as described herein can include any energy storage device, such as a battery storage device, a fuel cell, a capacitor, one or more battery modules, or other suitable energy storage device. The apparatus 300 may also include a user interface 316 configured to actuate the power converter 302 and communicate a test diagnostic or sequence to a user. In various embodiments, the user interface 316 provides a user-friendly apparatus 300 and requires minimal user intervention such that the apparatus 300 is effectively automated.

Figure 5:
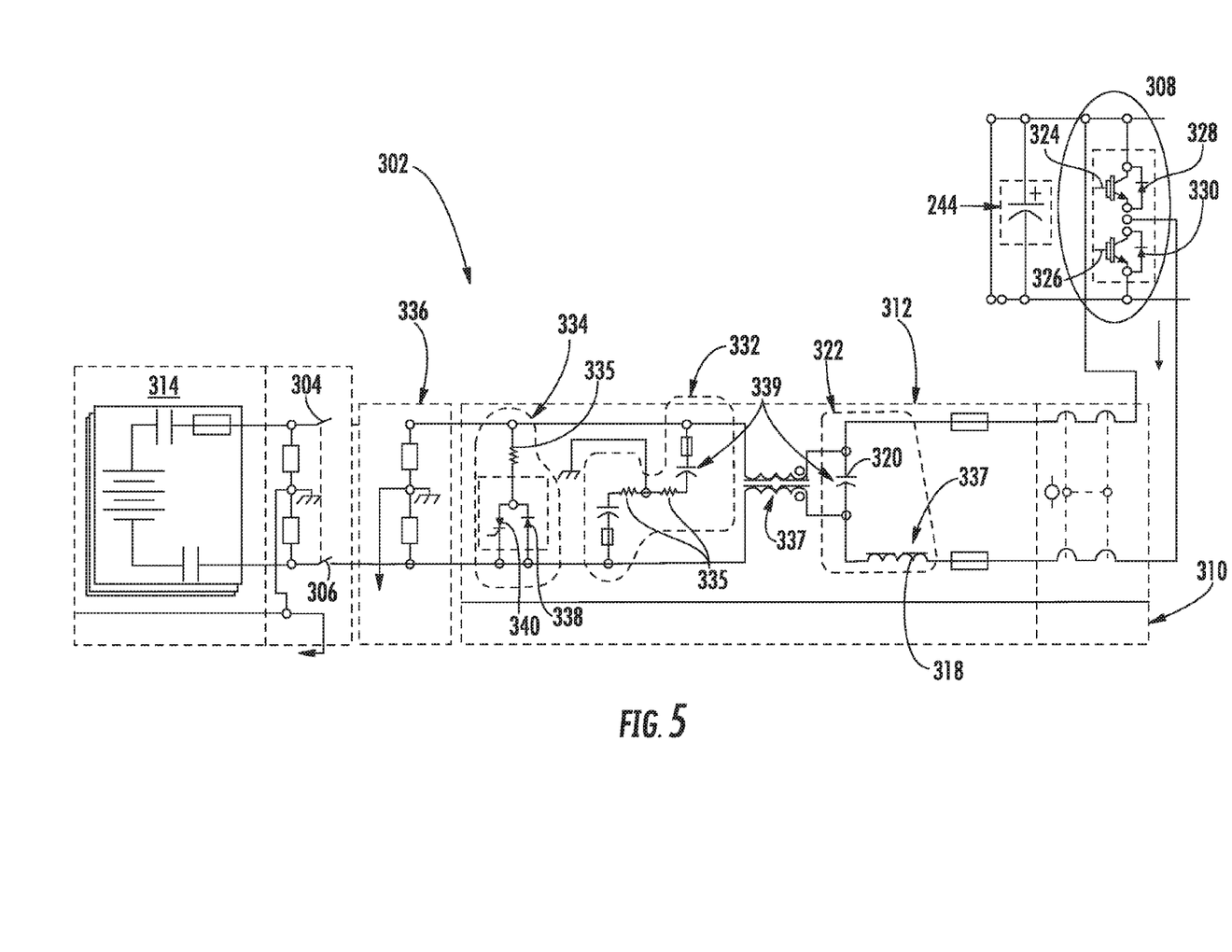
FIG. 5 illustrates a schematic diagram of one embodiment of various electrical components a power converter according to the present disclosure.

Referring now to FIG. 5, a more detailed schematic of one embodiment of the power converter 302 according to the present disclosure is illustrated. As shown, the power converter 302 includes bridge circuit 308, electrical disconnecting device 310, power filter 312, tower circuit 336, and energy storage system 314. The bridge circuit 308 generally includes one or more cells or cell arrangements. For example, in various embodiments, the bridge circuit 308 may include one or more switching elements 324, 326 (e.g. Insulated-Gate Bipolar Transistors (IGBTs)) and/or one or more diodes 328, 330. In still further embodiments, the bridge circuit 308 may include any suitable number of electrical components having any topology, including, but not limited to any one of or combination of the following: a diode, an IGBT, a relay, a silicon-controlled rectifier (SCR), a thyristor, a triode for alternating current (TRIAC), a metal-oxide-semiconductor field effect transistor (MOSFET), a junction gate field-effect transistor (JFET), a bipolar junction transistor (BJT), an integrated-gate commutated thyristor (IGCT), a gate turn-off thyristor (GTO), a MOS-controlled thyristor (MCT), a static induction transistor and thyristor (SIT), or similar.

Still referring to FIG. 5, the power filter 312 generally includes a RLC circuit, which is understood in the art to encompass an electrical circuit having one or more resistive elements 335, one or more inductive elements 337, and one or more capacitive elements 339, connected in series or parallel. More specifically, as shown, the power filter 312 may include a dominant capacitor 320 and a dominant inductor 318 as part of a dominant LC circuit 322. In addition, the power filter 312 may also include any number of additional inductive elements, capacitive elements, and resistive elements. For example, as shown, the power filter 312 includes inductive element 337 that connects the dominant LC circuit 322 to a secondary RC circuit 332. More specifically, as shown, the secondary RC circuit 332 also includes a plurality of resistive elements 337 and a plurality of capacitive elements 339 connected in series.

In addition, as shown, the power filter 312 includes a crowbar circuit 334. As shown, the crowbar circuit 334 generally includes one or more resistive elements 335, a voltage-controlled switching element 340, and at least anti-parallel diode 338. More specifically, in certain embodiments, the voltage-controlled switching element 340 may include a silicon-controlled rectifier (SCR) or a semiconductor switch. SCRs are generally unidirectional (i.e. can conduct current only in one direction) devices or thyristors that typically include an anode, a cathode, and a gate. Further, SCRs are normally triggered only by currents going into the gate, and typically only turn off when anode current in the circuit goes to zero. The resistive element 335 is configured to limit current between the two nodes of the SCR.

Figure 6:
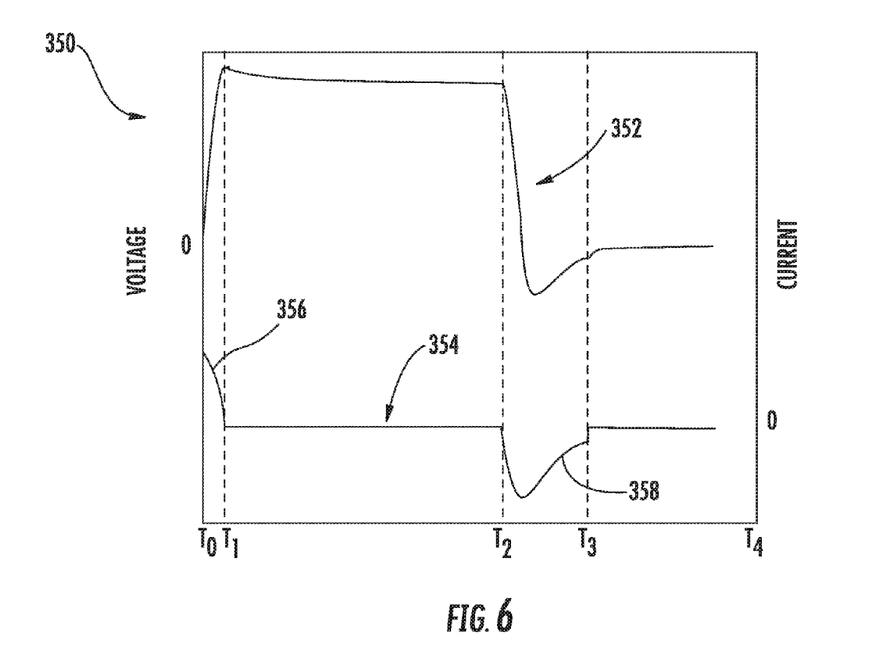
FIG. 6 illustrates a graph of test results from one embodiment of a test sequence for a properly operating diode according to the present disclosure.
Figure 7:
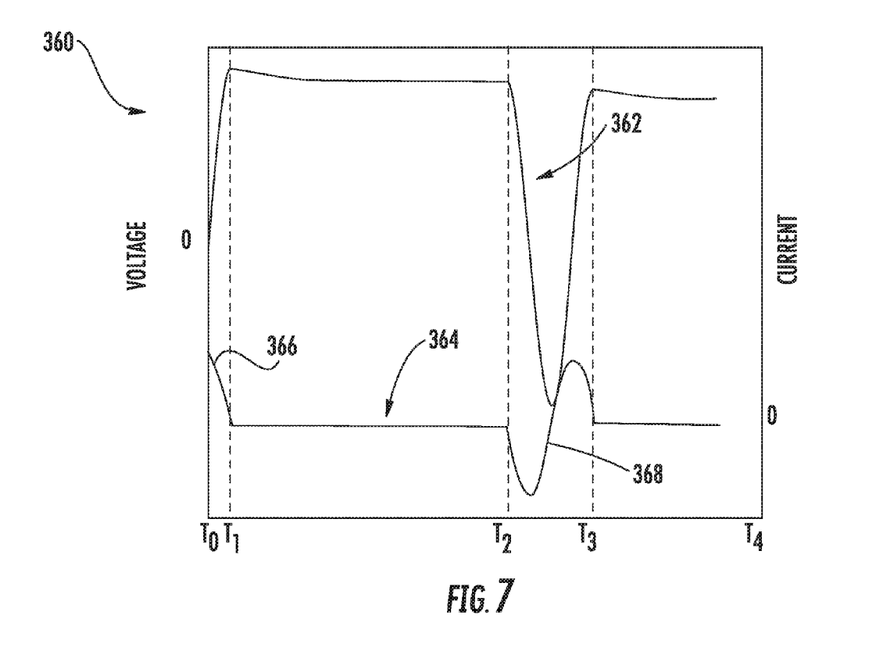
FIG. 7 illustrates a graph of test results from one embodiment of a test sequence for a diode that is not operating properly according to the present disclosure.
Figure 9:
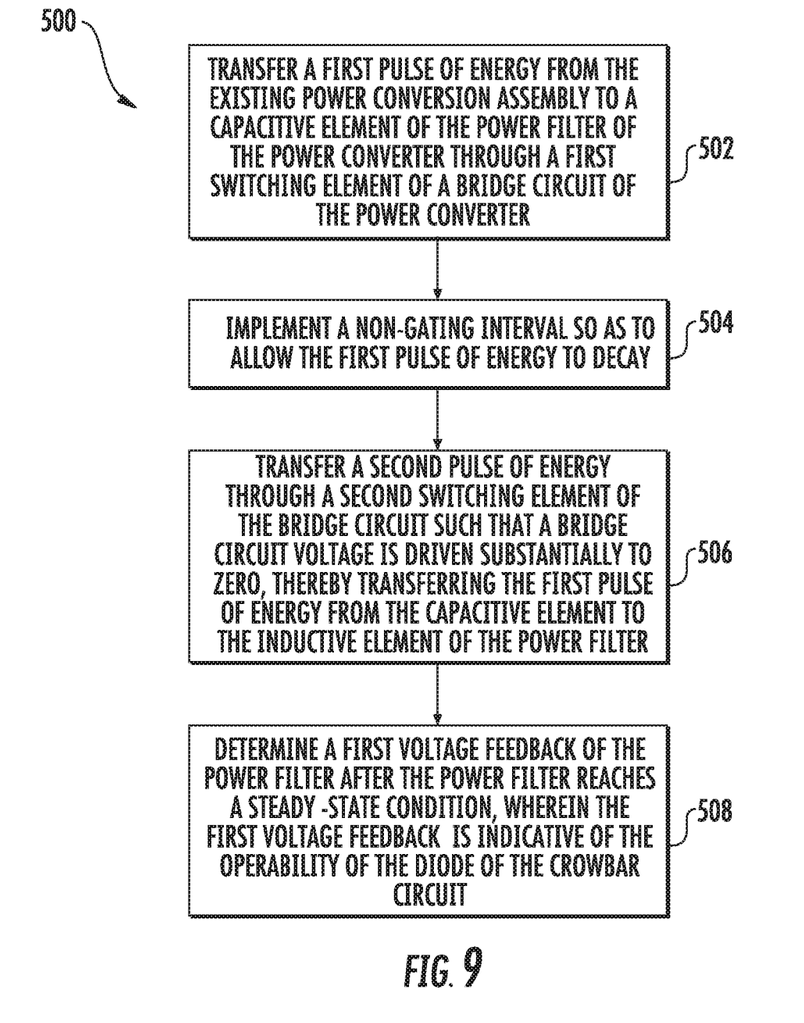
FIG. 9 illustrates a flow diagram of one embodiment of a method for testing a crowbar circuit of a power converter according to the present disclosure.

During operation, the apparatus 300 implements a test sequence to test each of the components in the crowbar circuit 334. For example, in one embodiment, the apparatus 300 implements a test sequence for testing operability of the diode 338 and implements another test sequence for testing operability of the voltage-controlled switching element 340. The diode test sequence, as generally illustrated in FIGS. 6-7 and 9, includes transferring a first pulse 356, 366 of energy as shown from time $T_0$ to $T_1$, e.g. a nominal peak current of the power filter 312, from the existing power conversion assembly 210, e.g. the DC link 244, into the dominant capacitive element 320 of the power filter 312 of the power converter 302 (step 502) through a first switching element (e.g. IGBT 324) of the bridge circuit 308. A next step includes implementing a non-gating interval, as shown between $T_1$ and $T_2$, so as to allow the first pulse 356, 366 of energy to decay (step 504). Once transient signals decay, the apparatus 300 transfers a second, longer pulse 358, 368 of energy through a second switching element (e.g. IGBT 326) of the bridge circuit 308 such that a bridge circuit voltage is driven substantially to zero, thereby transferring the first pulse of energy from the dominant capacitive element 320 to the dominant inductive element 318 of the power filter 312 (step 506). In various embodiments, the length of the second pulse 358, 368 is substantially equal to a full period of the expected natural frequency of the dominant inductive element 318 and the dominant capacitive element 320 of the power filter 312. After the power filter 312 reaches a steady-state condition (e.g. between time $T_3$ and $T_4$), the apparatus 300 determines a first current-voltage feedback of the power filter 312 that represents whether the diode 338 is operating properly (step 508).

From a voltage point of view, when the diode 338 is not present or is not operating properly as shown in FIG. 7, the voltage feedback 362 of the crowbar circuit 334 generally experiences a large oscillation (as shown between $T_2$ and $T_3$ of FIG. 7) that settles at a non-zero value after gating ceases, i.e. a value very similar to the voltage before gating. In further embodiments, a shorted or reversely-installed diode can prevent the power filter 312 capacitance from developing voltage after the first pulse of energy. Therefore, a subsequent non-gating interval will not show voltage and the test will indicate a failed diode. In such an embodiment, the apparatus would not implement the second pulse of energy. In contrast, when the diode 338 is present and operating properly as shown in FIG. 6, the voltage feedback 352 of the crowbar circuit 334 generally experiences a smaller decaying pulse (as shown between $T_2$ and $T_3$ of FIG. 6) that settles at a near zero voltage after gating is over. Thus, final voltage values (as shown between $T_3$ and $T_4$ of FIGS. 6 and 7) obtained when the diode test sequence is complete are distinct and obtainable through feedback circuitry to indicate whether the diode 338 is working properly.

From a current point of view, when the diode 338 is not present or is not operating properly as shown in FIG. 7, then the current feedback 364 of the crowbar circuit generally oscillates almost symmetrically (as shown between $T_2$ and $T_3$ of FIG. 7), which renders a near zero electrical charge (e.g. the area under current curve 364). In contrast, when the diode 338 is present and operating properly as shown in FIG. 6, then the current feedback 354 of the crowbar circuit 334 generally experiences a decaying unidirectional pulse with a nonzero charge as shown between $T_2$ and $T_3$ of FIG. 6. Thus, analysis of post-gating remaining current-voltage feedback signals is a robust criterion for validating anti-parallel cells, e.g. diodes, and/or the SCR 340 in the crowbar circuit 334.

It should be understood that the term "current-voltage feedback(s)" or variations thereof obtained from any of the test sequences as described herein is meant to encompass a current and/or voltage feedback of the power filter of the power converter. For example, in various embodiments, the current-voltage feedback(s) may include any one of or a combination of the following: a direct voltage value or measurement of the power filter 312, a flux value or measurement of the power filter 312, a direct current value or measurement of the power filter 312, or a charge value or measurement of the power filter 312. More specifically, in various embodiments, the flux measurement may be substantially equal to the area under the voltage curve generated during the first test sequence. Similarly, the charge measurement may be substantially equal to an area under the current curve generated during the first test sequence. Thus, when the diode is not operating properly, the area under the current curve may be substantially equal to zero. In contrast, when the diode is operating properly, the area under the current curve may include a nonzero value.

Figure 8:
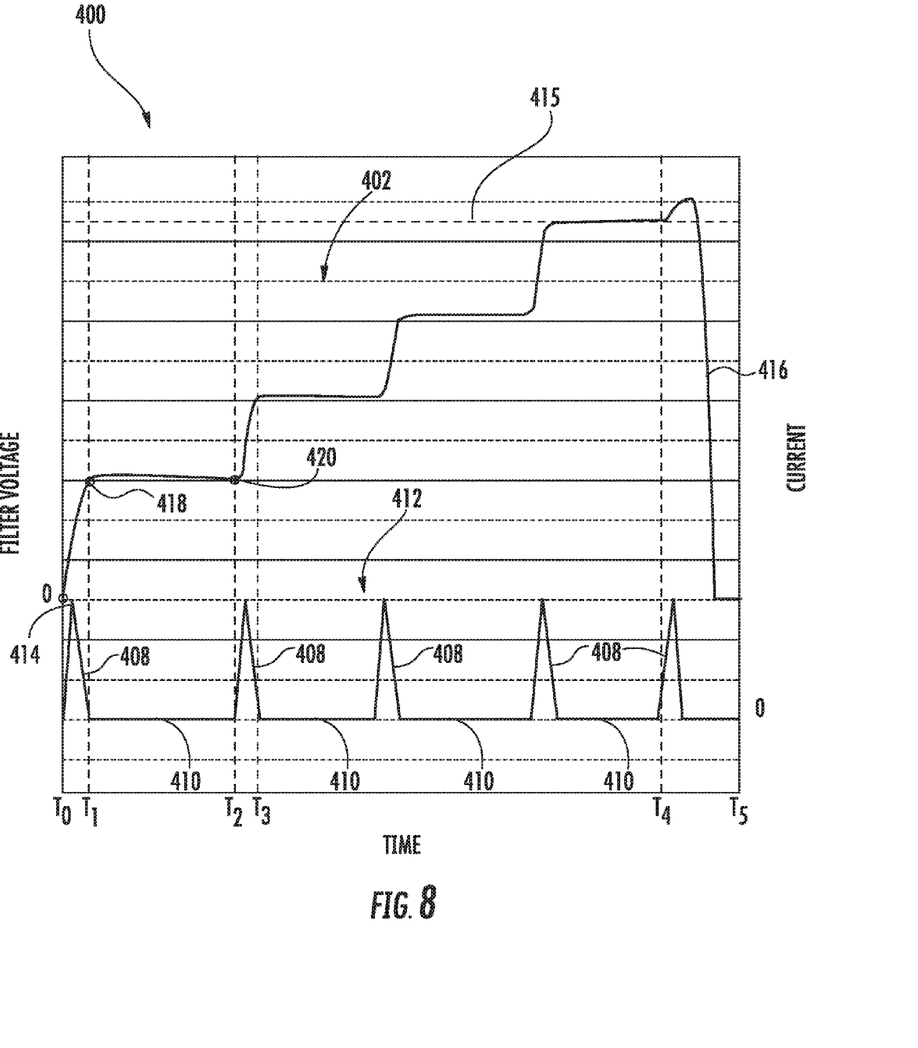
FIG. 8 illustrates a graph of test results from one embodiment of a test sequence for a voltage-controlled switching element according to the present disclosure.

In various embodiments, the diode test sequence may be performed first, and if the diode is functioning properly, then the apparatus 300 is configured to implement another test sequence for testing the voltage-controlled switching element 340 of the crowbar circuit 334. It should be understood, however, that the test sequences as described herein may be performed in any order. Referring to FIG. 8, during the switching-element test sequence, the apparatus 300 transfers a plurality of pulses 408 of energy from the existing power conversion assembly 210 to the power filter 312 in conjunction with interleaving non-gating intervals 410 between each of the additional pulses 408 of energy until a filter voltage reaches a predetermined voltage 415 and/or a predetermined voltage range. In certain embodiments, the predetermined voltage 415, as used herein, generally encompasses the highest theoretical voltage value across the switching element 340 that can be handled without causing the switching element 340 to turn on. In further embodiments, the predetermined voltage 415 is calculated based on voltage-controlled-switching element 340 ratings and/or tolerances.

More specifically, the graph 400 of FIG. 8 illustrates voltage of the power filter 312 versus time (curve 402) and current of the power filter 312 versus time (curve 412) during a test sequence for testing the switching element 340 of the crowbar circuit 334 according to the present disclosure. In the illustrated embodiment, the apparatus 300 performs the test sequence on a single phase DC-DC converter connected to a DC link 244 of a back-to-back wind power converter, though those of ordinary skill in the art will understand that the illustrated embodiment is for illustrative purposes only and the test sequence may be performed on any type of power converter for any type of energy system. More specifically, as shown between time $T_0$ and time $T_1$, the DC link 244 of the existing power conversion assembly 210 transfers a first pulse of energy 408 (as represented by peak current 414) into the power filter 312, which manifests as a nonzero voltage 418 when the current extinguishes at $T_1$. A subsequent period of gating inactivity 401 (e.g. between $T_1$ and $T_2$) provides an opportunity to probe the remaining voltage resulting from the transferred charge (i.e. the area under the current curve 412). The new voltage 420 at time $T_2$ becomes an initial condition that, together with crowbar nominal voltage and nominal converter current, is used to compute the following gating pulse (e.g. between $T_2$ and $T_3$).

The process is repeated until a developed filter voltage approaches a region where the voltage-controlled switching element 340 will turn on, e.g. just above the predetermined voltage 415 (as shown between time $T_4$ and $T_5$). For example, as shown in the illustrated embodiment of FIG. 8, the apparatus 300 transfers a total of five pulses until the predetermined voltage 415 is achieved. Thus, the final pulse is designed such that the voltage-controlled switching element 340 is guaranteed to turn on, while still operating within a safe operating voltage region. Such behavior is desirable in order to improve detectability of the voltage-controlled switching element 340 and to prevent overheating of the switching element 340 gating circuitry. It should be understood that the apparatus may transfer any number of pulses, including less than five or more than five.

From a voltage point of view, when the voltage-controlled switching element 340 is present and operating properly, voltage across the capacitive elements in the power filter 312 is expected to collapse (as shown between time $T_4$ and $T_5$ and indicated by element 416) due to the low resistance path provided by the voltage-controlled switching element 340 and its resistor 335 in series when the predetermined voltage 415 is surpassed. From a current point of view, once gating ceases and the current disappears, the current-voltage feedback is expected to be near zero, as shown between time $T_4$ and $T_5$. Thus, the presence and/or operability of the voltage-controlled switching element 340 can be automatically verified based on the current-voltage feedback and the predetermined voltage 415 during this time frame. It should be understood that the switching element 340 can turn on at any time. Thus, a malfunctioning switching element 340 can be detected in a variety of ways, including, but not limited to the switching element 340 turning on before reaching the predetermined voltage 415 level and/or non-zero current-voltage feedback(s) at the end of the switching-element test sequence.

Figure 10:
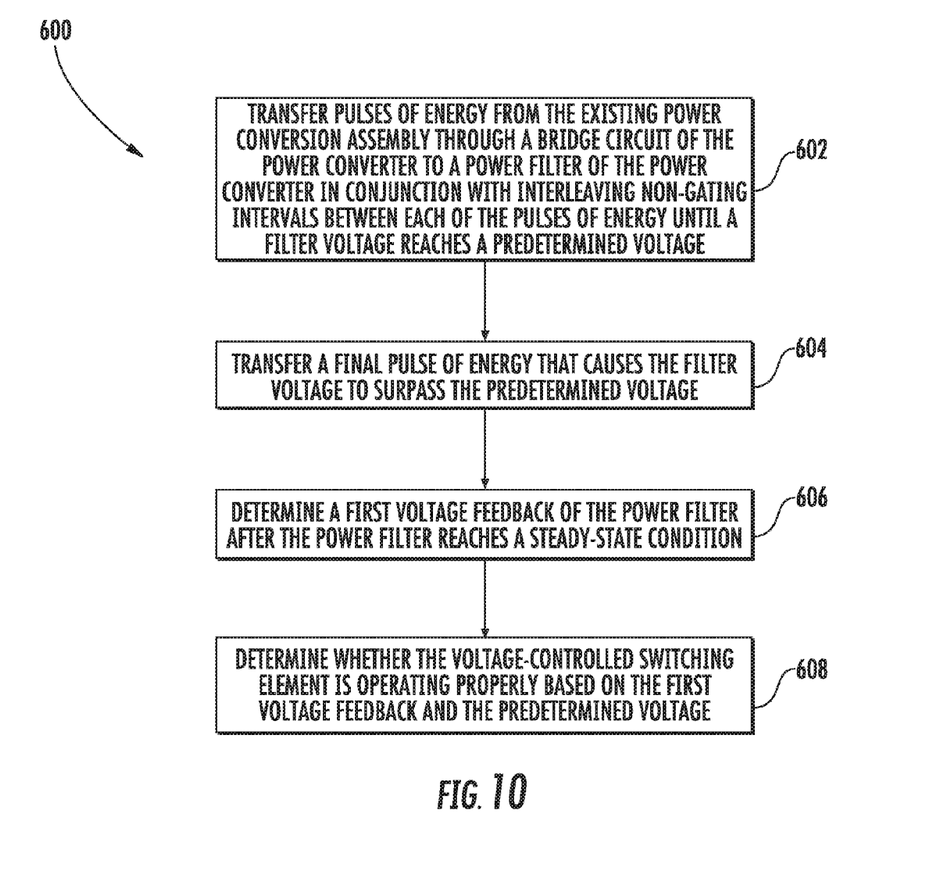
FIG. 10 illustrates a flow diagram of another embodiment of a method for testing a crowbar circuit of a power converter according to the present disclosure.

Referring now to FIG. 10, a flow diagram of one embodiment of the voltage-controlled switching-element test sequence 600 according to the present disclosure is illustrated. As shown, the test sequence 600 includes transferring pulses of energy from the existing power conversion assembly 210 through a bridge circuit 308 of the power converter 302 to a power filter 312 of the power converter 302 in conjunction with interleaving non-gating intervals between each of the pulses of energy until a filter voltage reaches a predetermined voltage (step 602). The test sequence 600 also includes transferring a final pulse of energy that causes the filter voltage to surpass the predetermined voltage (step 604) by an amount that guarantees that a properly operating voltage-controlled switching element 340 will turn on. Another step includes determining a first current-voltage feedback of the power filter 312 after the power filter 312 reaches a steady-state condition (step 606). Still a further step includes determining whether the voltage-controlled switching element is operating properly based on the first voltage feedback and the predetermined voltage (step 608).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for testing a crowbar circuit within a power converter with an existing power conversion assembly of a renewable energy system, the method comprising:
   implementing a first test sequence for testing operability of an anti-parallel diode of the crowbar circuit, the first test sequence further comprising:
   transferring a first pulse of energy from the existing power conversion assembly to a capacitive element of a power filter of the power converter through a first switching element of a bridge circuit of the power converter;
   implementing a non-gating interval so as to allow the first pulse of energy to decay;
   transferring a second pulse of energy through a second switching element of the bridge circuit such that a bridge circuit voltage is driven substantially to zero, thereby transferring the first pulse of energy from the capacitive element to the inductive element of the power filter; and,
   determining a first current-voltage feedback of the power filter of the power converter based on the first test sequence after the power filter reaches a steady-state condition, wherein the first current-voltage feedback is indicative of operability of the anti-parallel diode of the crowbar circuit, the first current-voltage comprising a voltage value substantially equal to zero when the diode is operating properly or substantially equal to an initial voltage of the power filter before the first pulse of energy was transferred when the diode is not operating properly;

implementing a second test sequence for testing operability of a voltage-controlled switching element of the crowbar circuit; and, determining a second current-voltage feedback of the power converter based on the second test sequence, wherein the second current-voltage feedback is indicative of operability of the voltage-controlled switching element of the crowbar circuit.

2. The method of claim 1, further comprising implementing the second test sequence for testing operability of the voltage-controlled switching element of the crowbar circuit when the first current-voltage feedback comprises a voltage value substantially equal to zero due to the diode operating properly.

3. The method of claim 1, wherein the second test sequence further comprises:

transferring a plurality of additional pulses of energy from the existing power conversion assembly to the power filter in conjunction with interleaving non-gating intervals between each of the additional pulses of energy until a filter voltage reaches a predetermined voltage, transferring a final pulse of energy that causes the filter voltage to surpass the predetermined voltage, determining the second current-voltage feedback of the power filter after the power filter reaches a steady-state condition, and determining whether the voltage-controlled switching element is operating properly based on the second current-voltage feedback and the predetermined voltage.

4. The method of claim 3, wherein, when the voltage-controlled switching element is operating properly, the second current-voltage feedback comprises a voltage value substantially equal to zero and the predetermined voltage comprises a voltage value that is within system tolerances of the voltage-controlled switching element, and wherein, when the voltage-controlled switching element is not operating properly, the second current-voltage feedback comprises a voltage value substantially larger than the predetermined voltage.

5. The method of claim 1, wherein the voltage-controlled switching element of the crowbar circuit further comprises at least one of a silicon-controlled rectifier (SCR) or a semiconductor switch.

6. The method of claim 1, wherein the first pulse of energy corresponds to a nominal peak current of the power filter.

7. The method of claim 1, further comprising transferring the first pulse of energy for a first time frame and transferring the second pulse of energy for a second time frame, the second time frame being longer than the time frame.

8. The method of claim 7, wherein the second time frame is substantially equal to at least one full cycle of the expected natural frequency of a dominant inductive element and a dominant capacitive element of the power filter.

9. The method of claim 3, further comprising transferring the first pulse of energy and the plurality of additional pulses of energy to a capacitive element of the power filter.

10. The method of claim 1, wherein the first current-voltage feedback comprises at least one of a first voltage measurement of the power filter at the steady-state condition, a first flux measurement of the power filter, a first current measurement of the power filter, or a first charge measurement of the power filter, wherein the first flux measurement comprises an area under a voltage curve generated during the first test sequence, and wherein the first charge measurement comprises an area under a current curve generated during the first test sequence.

11. The method of claim 3, wherein the second current-voltage feedback comprises at least one of a second voltage measurement of the power filter at the steady-state condition, a second flux measurement of the power filter, a second current measurement of the power filter, or a second charge measurement of the power filter, wherein the second flux measurement comprises an area under a voltage curve generated during the second test sequence, and wherein the second charge measurement comprises an area under a current curve generated during the second test sequence.

12. A method for testing a crowbar circuit within a power converter with an existing power conversion assembly of a renewable energy system, the method comprising:

implementing a first test sequence for testing operability of a voltage-controlled switching element of the crowbar circuit, the first test sequence comprising:

transferring pulses of energy from the existing power conversion assembly through a bridge circuit of the power converter to a power filter of the power converter in conjunction with interleaving non-gating intervals between each of the pulses of energy until a filter voltage reaches a predetermined voltage, transferring a final pulse of energy that causes the filter voltage to surpass the predetermined voltage, determining a first current-voltage feedback of the power filter, the power filter reaches a steady-state condition, and determining whether the voltage-controlled switching element is operating properly based on the first current-voltage feedback and the predetermined voltage, wherein, when the voltage-controlled switching element is operating properly, the first current-voltage feedback comprises a voltage value substantially equal to zero and the predetermined voltage comprises a voltage value that is within system tolerances, and wherein, when the voltage-controlled switching element is not operating properly, the first current-voltage feedback comprises a voltage value substantially larger than the predetermined voltage;

implementing a second test sequence for testing operability of an anti-parallel diode of the crowbar circuit; and, determining a second current-voltage feedback of the power converter based on the second test sequence, wherein the second current-voltage feedback is indicative of operability of the anti-parallel diode of the crowbar circuit.

13. The method of claim 12, wherein the second test sequence further comprises:

transferring a first pulse of energy from the existing power conversion assembly to a capacitive element of the power filter;

implementing a non-gating interval so as to allow the first pulse of energy to decay;

transferring a second pulse of energy through a second switching element of the bridge circuit such that a bridge circuit voltage is driven substantially to zero, thereby transferring the first pulse of energy from the capacitive element to the inductive element of the power filter; and determining a second current-voltage feedback of the power filter after the power filter reaches a steady-state condition, wherein the second current-voltage feedback is indicative of the operability of the diode of the crowbar circuit.

14. The method of claim 12, wherein, when the voltage-controlled switching element is operating properly, the first current-voltage feedback comprises a voltage value substantially equal to zero, and wherein, when the voltage-controlled switching element is not operating properly, the first current-voltage feedback comprises a voltage value substantially equal to an initial voltage of the power filter before the second pulse of energy was transferred.

15. The method of claim 13, wherein the first current-voltage feedback comprises at least one of a first voltage measurement of the power filter at an end of the first test sequence or a first flux measurement of the power filter, wherein the first flux measurement comprises an area under a voltage curve generated during the first test sequence, wherein the second current-voltage feedback comprises at least one of a second voltage measurement of the power filter at an end of the second test sequence or a second flux measurement of the power filter, wherein the second flux measurement comprises an area under a voltage curve generated during the second test sequence.

16. An apparatus for testing a crowbar circuit within a power converter with an existing power conversion assembly of a renewable energy system, the apparatus comprising:
the power converter electrically coupled with the existing power conversion assembly, the power converter comprising a bridge circuit, a power filter, and a crowbar circuit, the crowbar circuit comprising a voltage-controlled switching element and a diode;
a controller communicatively coupled to the power converter, the controller configured to perform a plurality of operations, the operations comprising:
implementing a test sequence for testing operability of the crowbar circuit, the test sequence comprising:
transferring a first pulse of energy from the existing power conversion assembly to a capacitive element of the power filter through the bridge circuit,
implementing a non-gating interval so as to allow the first pulse of energy to decay,
transferring a second pulse of energy through a second switching element of the bridge circuit such that a bridge circuit voltage is driven substantially to zero, thereby transferring the first pulse of energy from the capacitive element to the inductive element of the power filter,
determining a first current-voltage feedback of the power filter after the power filter reaches a steady-state condition, wherein the first current-voltage feedback is indicative of the operability of the diode, the first current-voltage feedback comprising a voltage value substantially equal to zero when the diode is operating properly or substantially equal to an initial voltage of the power filter before the first pulse of energy was transferred when the diode is not operating properly,
transferring a plurality of additional pulses of energy from the existing power conversion assembly through the bridge circuit to the power filter in conjunction with interleaving non-gating intervals between each of the additional pulses of energy until a filter voltage reaches a predetermined voltage,
transferring a final pulse of energy that causes the filter voltage to surpass the predetermined voltage,
determining a second current-voltage feedback of the power filter after the power filter reaches a steady-state condition, and
determining whether the voltage-controlled switching element is operating properly based on the second current-voltage feedback and the predetermined voltage.

* * * * *